United States Patent
Renau et al.

(10) Patent No.: US 7,402,816 B2
(45) Date of Patent: Jul. 22, 2008

(54) ELECTRON INJECTION IN ION IMPLANTER MAGNETS

(75) Inventors: Anthony Renau, West Newbury, MA (US); Donna L. Smatlak, Belmont, MA (US); James Buff, Brookline, NH (US); Eric Hermanson, Georgetown, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 325 days.

(21) Appl. No.: 11/281,175

(22) Filed: Nov. 17, 2005

(65) Prior Publication Data

US 2006/0169912 A1  Aug. 3, 2006

Related U.S. Application Data

(60) Provisional application No. 60/727,769, filed on Oct. 18, 2005, provisional application No. 60/629,513, filed on Nov. 19, 2004.

(51) Int. Cl.
*H01J 1/50* (2006.01)

(52) U.S. Cl. .................. 250/396 ML; 250/492.21; 250/491.1; 250/396 R; 250/281; 335/210; 335/213

(58) Field of Classification Search .......... 250/396 ML, 250/423 R, 492.21, 491.1, 493.1, 494.1, 396 R, 250/281; 335/210, 213
See application file for complete search history.

(56) References Cited

U.S. PATENT DOCUMENTS

| | | | | |
|---|---|---|---|---|
| 5,136,171 A | * | 8/1992 | Leung et al. | 250/492.2 |
| 5,703,375 A | * | 12/1997 | Chen et al. | 250/492.21 |
| 5,757,018 A | * | 5/1998 | Mack et al. | 250/492.21 |
| 6,100,536 A | * | 8/2000 | Ito et al. | 250/492.21 |
| 6,414,329 B1 | * | 7/2002 | Benveniste et al. | 250/492.21 |
| 6,452,197 B1 | * | 9/2002 | Ito | 250/492.21 |
| 6,476,399 B1 | * | 11/2002 | Harrington et al. | 250/492.21 |
| 6,515,408 B1 | * | 2/2003 | England et al. | 313/359.1 |
| 6,835,930 B2 | * | 12/2004 | Benveniste et al. | 250/298 |
| 6,867,422 B1 | * | 3/2005 | Ito et al. | 250/492.21 |
| 6,891,174 B2 | * | 5/2005 | Wenzel et al. | 250/492.21 |
| 2002/0088950 A1 | * | 7/2002 | Hamamoto et al. | 250/492.21 |
| 2003/0201402 A1 | * | 10/2003 | Ye et al. | 250/492.21 |
| 2004/0084635 A1 | * | 5/2004 | Liebert et al. | 250/492.21 |

FOREIGN PATENT DOCUMENTS

| EP | 0880161 A | * | 10/1988 |
|---|---|---|---|
| JP | H09 180662 | * | 11/1997 |
| JP | 63 131448 A | * | 11/1998 |

* cited by examiner

*Primary Examiner*—Jack I. Berman
*Assistant Examiner*—Michael J Logie

(57) ABSTRACT

One or more electron sources are utilized to inject electrons into an ion beam being transported between the polepieces of a magnet. In some embodiments, the electron sources are located in cavities in one or both polepieces of the magnet. In other embodiments, a radio frequency or microwave plasma flood gun is located in a cavity in at least one of the polepieces or between the polepieces.

24 Claims, 11 Drawing Sheets

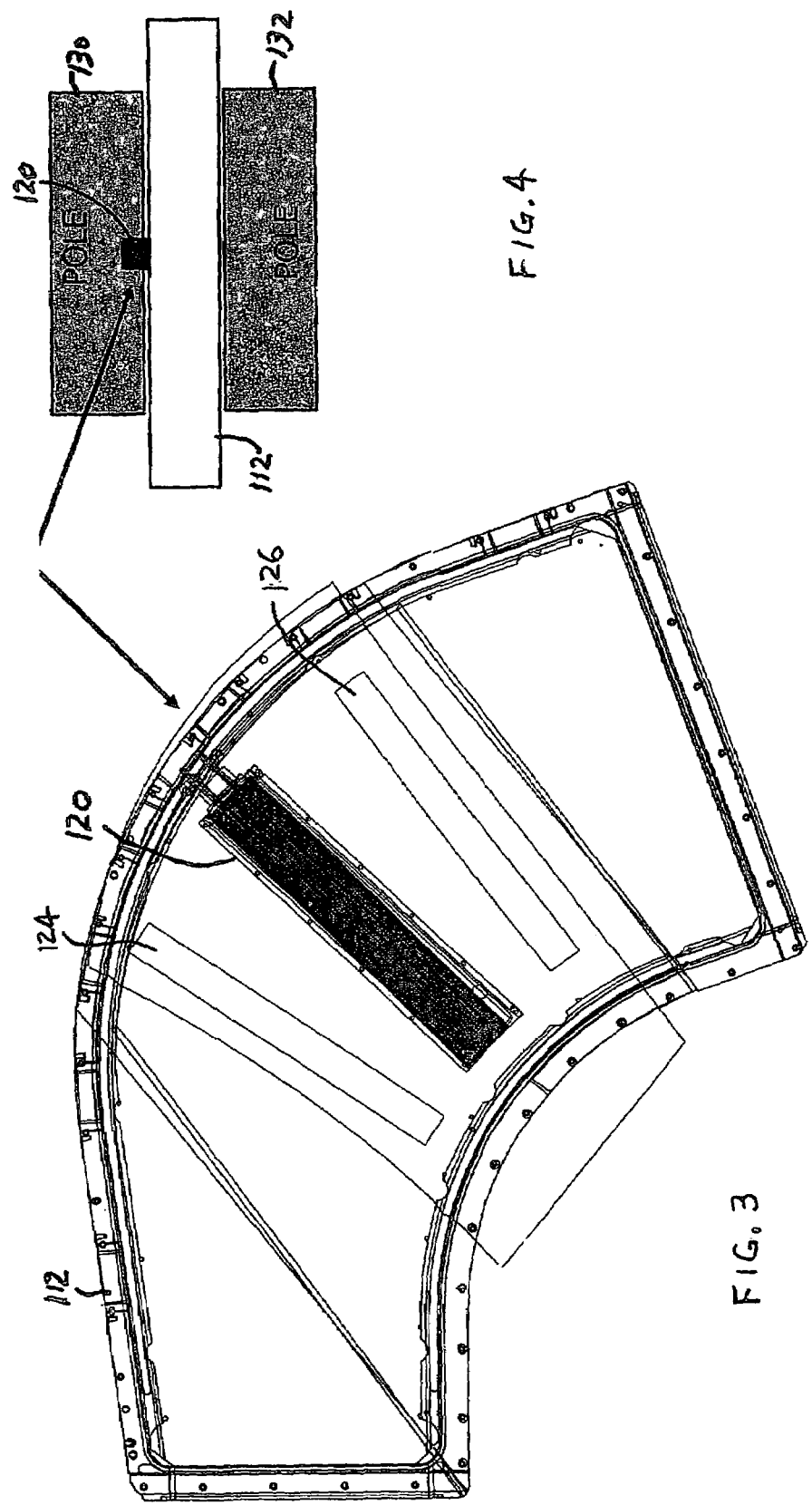

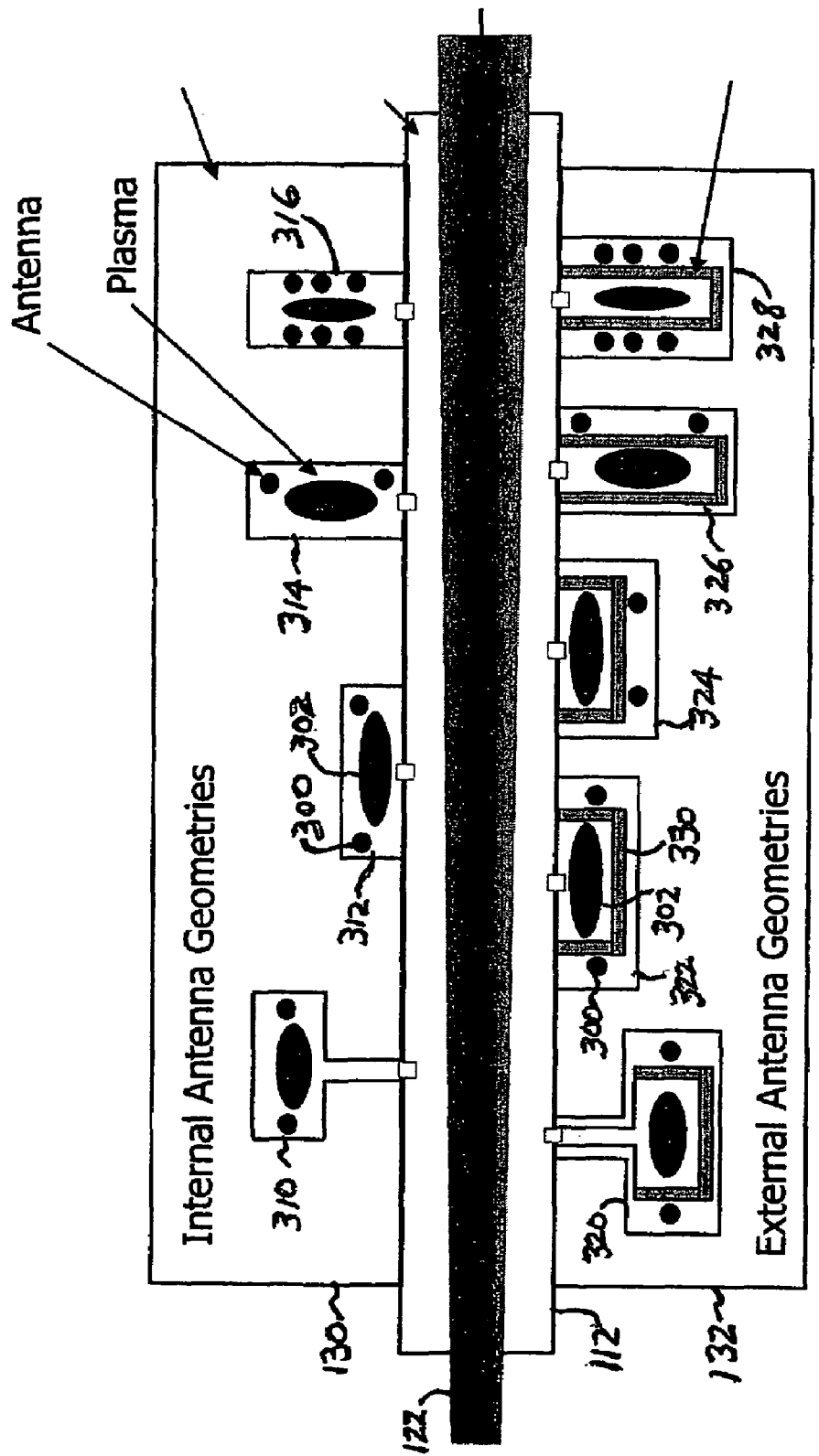

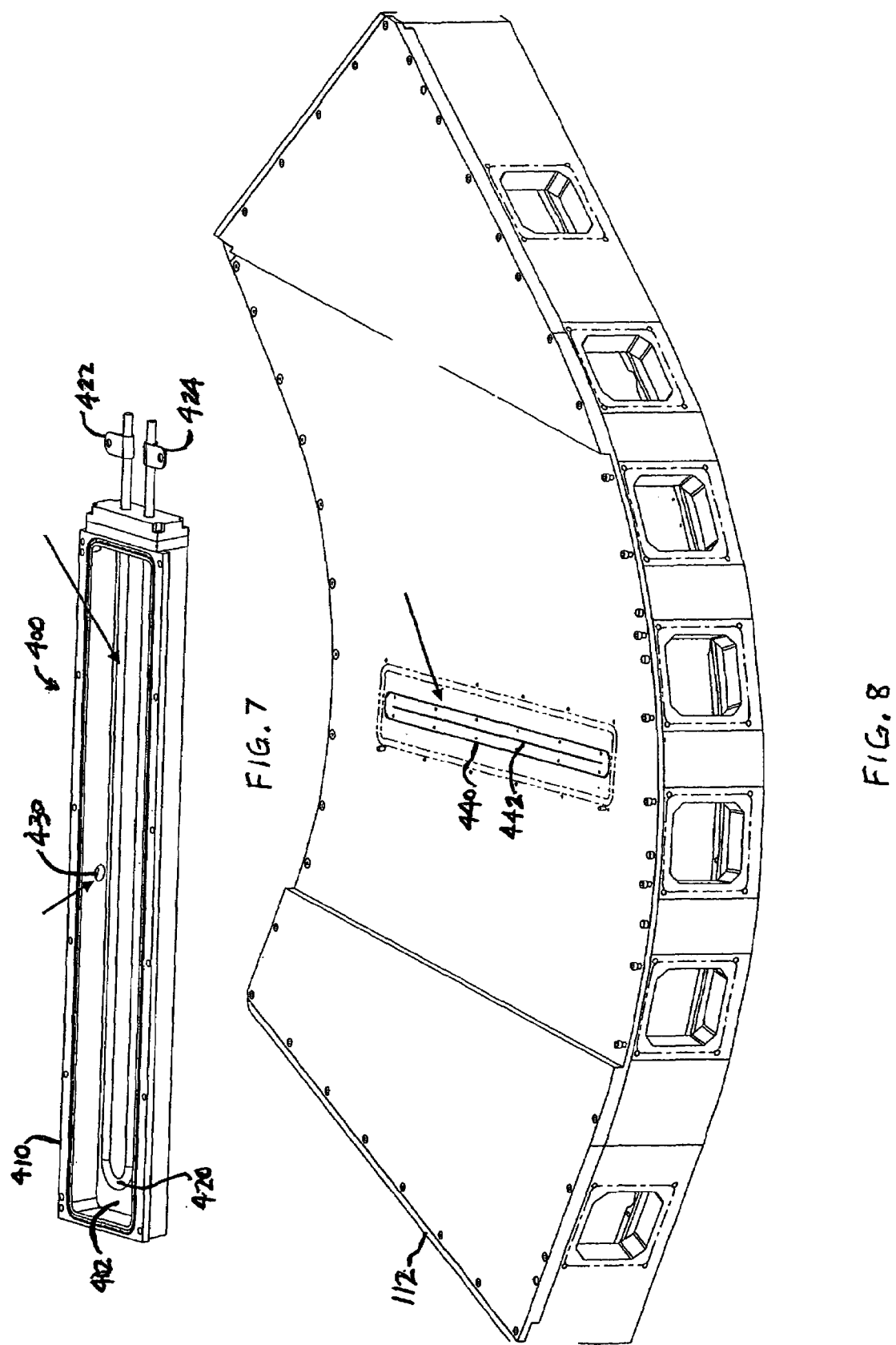

ELECTRON INJECTION IN ION IMPLANTER MAGNETS

CROSS REFERENCE TO RELATED APPLICATIONS

This application claims the benefit of Provisional Application Ser. No. 60/629,513, filed Nov. 19, 2004, and Provisional Application Ser. No. 60/727,769, filed Oct. 18, 2005, which are hereby incorporated by reference in their entirety.

FIELD OF THE INVENTION

This invention relates to systems and methods for ion implantation and, more particularly, to methods and apparatus for transport of low energy ion beams through magnets.

BACKGROUND OF THE INVENTION

Ion implantation systems usually include an ion source for converting a dopant material into a well-defined ion beam. The ion beam is mass analyzed to eliminate undesired ion species, is accelerated to a desired energy and is directed onto a target plane. The beam may be distributed over the target, typically a semiconductor wafer, by beam scanning, by target movement or by a combination of beam scanning and target movement. A number of different ion implanter architectures are known to those skilled in the art.

The ion implanter typically includes one or more magnets, depending on the beam transport architecture. The magnets perform functions such as mass analysis to remove undesired species from the ion beam and angle correction, or collimation, of the ion beam. Such magnets typically include polepieces on opposite sides of a flight tube through which the ion beam is transported. The magnet produces a magnetic field which deflects charged particles in the ion beam in a desired manner. Examples of ion implanter architectures utilizing magnets are disclosed in U.S. Pat. No. 4,922,106, issued May 1, 1990 to Berrian et al.; U.S. Pat. No. 5,350,926, issued Sep. 27, 1994 to White et al.; and U.S. Pat. No. 6,313,475, issued Nov. 6, 2001 to Renau et al.

Current semiconductor fabrication processes often require high-current, low-energy ion beams. High currents are required to limit implant time, while low energies are required to produce shallow junction semiconductor devices. Low-energy, high-current ion beams are very difficult to transport over large distances due to space charge blowup of the beam. It is known that space charge neutralization of an ion beam containing electrons is necessary for transport of low-energy, high-current ion beams. Electrons can be produced by both beam/surface and beam/gas collisions. However, at low ion beam energies, the cross-section for beam/gas collisions drops off dramatically, so that this method is unsatisfactory. In regions of magnetic field, the electrons that are produced by collisions are inhibited from moving to electron-deficient regions. Therefore, neutralization in regions of high magnetic field is particularly difficult. Techniques for beam containment in magnets are disclosed in U.S. Pat. No. 6,414,329, issued Jul. 2, 2002 to Benveniste et al; U.S. Pat. No. 6,762,423, issued Jul. 13, 2004 to Liebert et al.; and U.S. Pat. No. 6,515,408, issued Feb. 4, 2003 to England et al.

Prior art techniques have had one or more drawbacks, including but not limited to a relatively short lifetime and contamination of the semiconductor wafer. In those configurations that utilize filaments located between the polepieces of a magnet, the space occupied by the filaments reduces the space available for transport of the ion beam. Accordingly, there is a need for improved methods and apparatus for electron injection in magnets.

SUMMARY OF THE INVENTION

One or more electron sources are utilized to inject electrons into an ion beam being transported between the polepieces of a magnet. In some embodiments, electron sources are located in cavities in one or both polepieces of the magnet. In other embodiments, a radio frequency (RF) or microwave plasma flood gun is located in a cavity in at least one of the polepieces or between the polepieces. Beam transport is improved with little or no contamination, limited pressure increase and long life.

According to a first aspect of the invention, a magnet assembly is provided for operation with an ion beam. The magnet assembly comprises a magnet including spaced-apart first and second polepieces, a flight tube for transport of an ion beam between the first and second polepieces, and an electron source positioned in a cavity in at least one of the first and second polepieces to inject electrons into the flight tube.

According to a second aspect of the invention, an ion implanter comprises an ion source to generate an ion beam, a magnet including spaced-apart first and second polepieces, a flight tube for transport of the ion beam between the first and second polepieces, an electron source positioned in a cavity in at least one of the first and second polepieces to inject electrons into the flight tube, and a target site downstream of the magnet to support a target for ion implantation, wherein the ion beam is transported through the flight tube to the target site.

According to a third aspect of the invention, a method is provided for transporting an ion beam through a magnet. The method comprises transporting an ion beam between first and second polepieces of a magnet, and injecting electrons into the ion beam being transported between the first and second polepieces from an electron source positioned in a cavity in at least one of the first and second polepieces.

According to a fourth aspect of the invention, a magnet assembly is provided for operation with an ion beam. The magnet assembly comprises a magnet including spaced-apart first and second polepieces, a flight tube for transport of an ion beam between the polepieces of the magnet, and a radio frequency or microwave plasma flood gun positioned between the first and second polepieces or in a cavity in at least one of the first and second polepieces to inject electrons into the flight tube.

According to a fifth aspect of the invention, an ion implanter comprises an ion source to generate a ion beam, a magnet including spaced-apart first and second polepieces, a flight tube for transport of the ion beam between the first and second polepieces, a radio frequency or microwave plasma flood gun positioned between the first and second polepieces or in a cavity in at least one of the first and second polepieces to inject electrons into the flight tube, and a target site downstream of the magnet to support a target for ion implantation, wherein the ion beam is transported through the flight tube to the target site.

According to a sixth aspect of the invention, a method is provided for transporting an ion beam through a magnet. The method comprises transporting an ion beam between first and second polepieces of a magnet, and injecting electrons into the ion beam being transported between the first and second polepieces from a radio frequency or microwave plasma flood gun positioned between the first and second polepieces or in a cavity in at least one of the first and second polepieces.

BRIEF DESCRIPTION OF THE DRAWINGS

For a better understanding of the present invention, reference is made to the accompanying drawings, which are incorporated herein by reference and in which:

FIG. 3 is a top view of a magnet assembly incorporating an RF or microwave plasma flood gun;

FIG. 4 is a schematic side view of a magnet assembly incorporating an RF or microwave plasma flood gun;

FIG. 6 is a schematic side view of a magnet assembly, illustrating different possible configurations of an RF plasma flood gun;

FIG. 7 is an isometric view of an RF plasma flood gun in accordance with an embodiment of the invention;

FIG. 8 is an isometric view of a flight tube modified to receive the RF plasma flood gun of FIG. 7;

DETAILED DESCRIPTION

Figure 1:
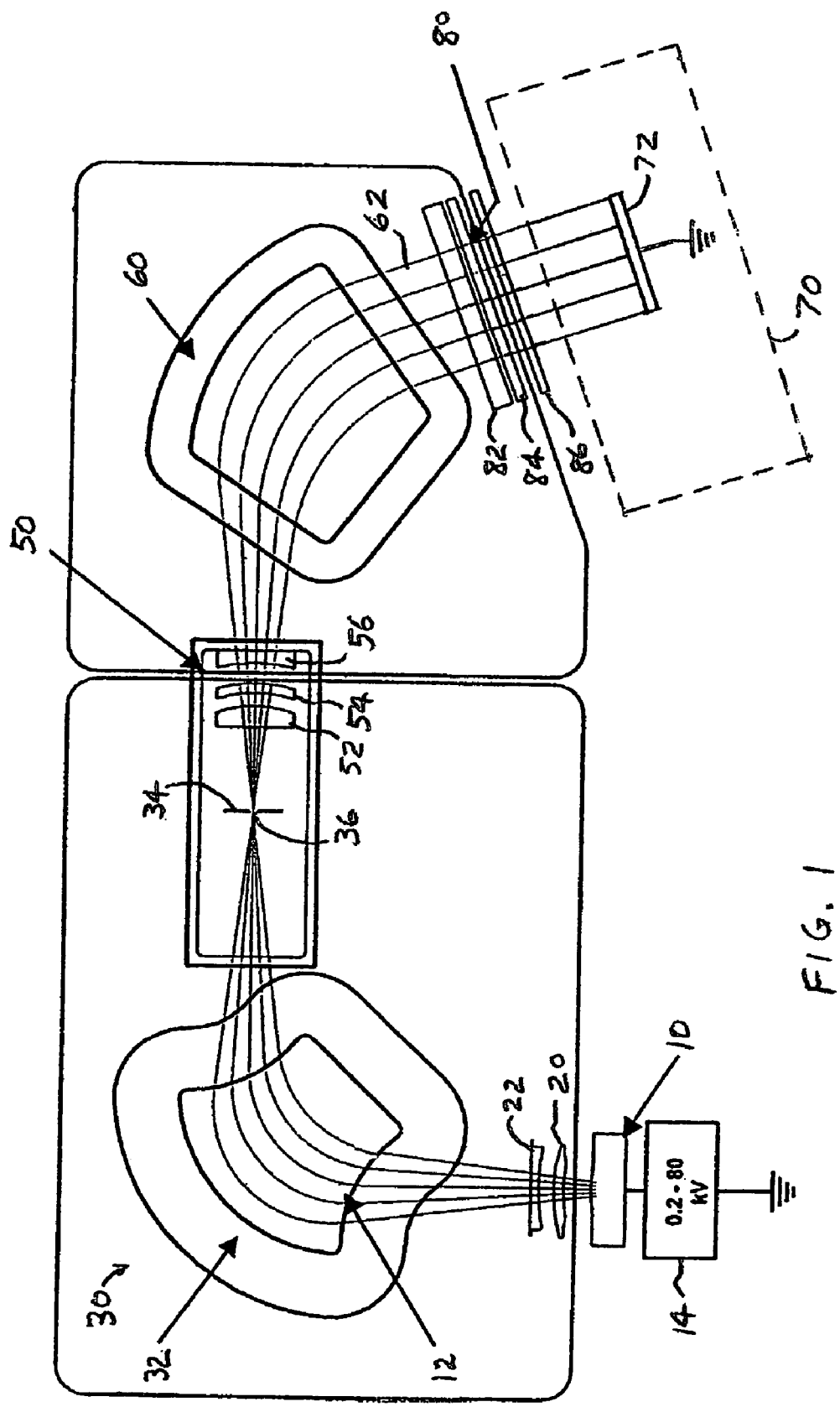
FIG. 1 is a simplified schematic diagram of an embodiment of an ion implanter.

A block diagram of an embodiment of an ion implanter is shown in FIG. 1. An ion source 10 generates ions and supplies an ion beam 12. Ion source 10 may include an ion chamber and a gas box containing a gas to be ionized. The gas is supplied to the ion chamber where it is ionized. The ions thus formed are extracted from the ion chamber to form ion beam 12. Ion beam 12 is directed between the poles of a resolving magnet 32. A first power supply 14 is connected to an extraction electrode of ion source 10 and provides a positive first voltage $V_0$. First voltage $V_0$ may be adjustable, for example, from about 0.2 to a 80 kV. Thus, ions from ion source 10 are accelerated to energies of about 0.2 to 80 KeV by the first voltage $V_0$.

Ion beam 12 passes through a suppression electrode 20 and a ground electrode 22 to a mass analyzer 30. The mass analyzer 30 includes resolving magnet 32 and a masking electrode 34 having a resolving aperture 36. Resolving magnet 32 deflects ions in ion beam 12 such that ions of a desired ion species pass through resolving aperture 36 and undesired ion species do not pass through resolving aperture 36 but are blocked by the masking electrode 34. In one embodiment, resolving magnet 32 deflects ions of the desired species by 90°.

Ions of the desired ion species pass through resolving aperture 36 to a first deceleration stage 50 positioned downstream of mass analyzer 30. Deceleration stage 50 may include an upstream electrode 52, a suppression electrode 54 and a downstream electrode 56. Ions in the ion beam are decelerated by deceleration stage 50 and then pass through an angle corrector magnet 60. Angle corrector magnet 60 deflects ions of the desired ion species and converts the ion beam from a diverging ion beam to a ribbon ion beam 62 having substantially parallel ion trajectories. In one embodiment, angle corrector magnet 60 deflects ions of the desired ion species by 70°.

An end station 70 supports one or more semiconductor wafers, such as wafer 72, in the path of ribbon ion beam 62 such that ions of the desired species are implanted into the semiconductor wafer. The end station 70 may include a cooled electrostatic platen and a scanner (not shown) for moving wafer 72 perpendicular to the long dimension of the ribbon ion beam 62 cross-section, so as to distribute ions over the surface of wafer 72. The ribbon ion beam may be at least as wide as wafer 72.

The ion implanter may include a second deceleration stage 80 positioned downstream of angle corrector magnet 60. Deceleration stage 80 may include an upstream electrode 82, a suppression electrode 84 and a downstream electrode 86.

The ion implanter may include additional components known to those skilled in the art. For example, end station 70 typically includes automated wafer handling equipment for introducing wafers into the ion implanter and for removing wafers after ion implantation. End station 70 may also include a dose measuring system, an electron flood gun and other known components. It will be understood that the entire path traversed by the ion beam is evacuated during ion implantation.

The ion implanter of FIG. 1 may operate in one of several modes. In a first operating mode, known as the drift mode, deceleration stages 50 and 80 are connected to ground, and the ion beam 12 is transported through the beamline at the final beam energy established after extraction from ion source 10. In a second operating mode, known as the enhanced drift mode, the ion beam 12 is accelerated to an intermediate energy at electrode 22 before passing through mass analyzer 30 and then is decelerated to the final beam energy by first deceleration stage 50. In a third operating mode, known as the double deceleration mode, the ion beam is accelerated to a first intermediate energy at electrode 22 before passing through mass analyzer 30, is decelerated by first deceleration stage 50 to a second intermediate energy as it passes through angle corrector 60 and then is decelerated to the final beam energy by second deceleration stage 80. A fourth operating mode transports the beam at the intermediate energy through to the second deceleration stage 80, and the gap at the first deceleration stage 50 is operated with a short circuit shunt. By transporting the ion beam through part of the beamline at higher energy, space charge expansion can be reduced in comparison with the drift mode for a given final beam energy.

It will be understood that the ion implanter architecture shown in FIG. 1 and described above is given by way of example only and that other ion implanter architectures are included within the scope of the invention.

As noted above, space charge expansion of low energy ion beams is problematic in magnets, because the gap between magnet polepieces is typically small and the beam path through the magnet is typically long. Thus, in the ion implanter of FIG. 1, ion beam 12 may undergo space charge expansion as it is transported through resolving magnet 32 and angle corrector magnet 60. Space charge expansion causes the ion beam to strike beamline components and results in reduced beam current delivered to the wafer.

Figure 2:
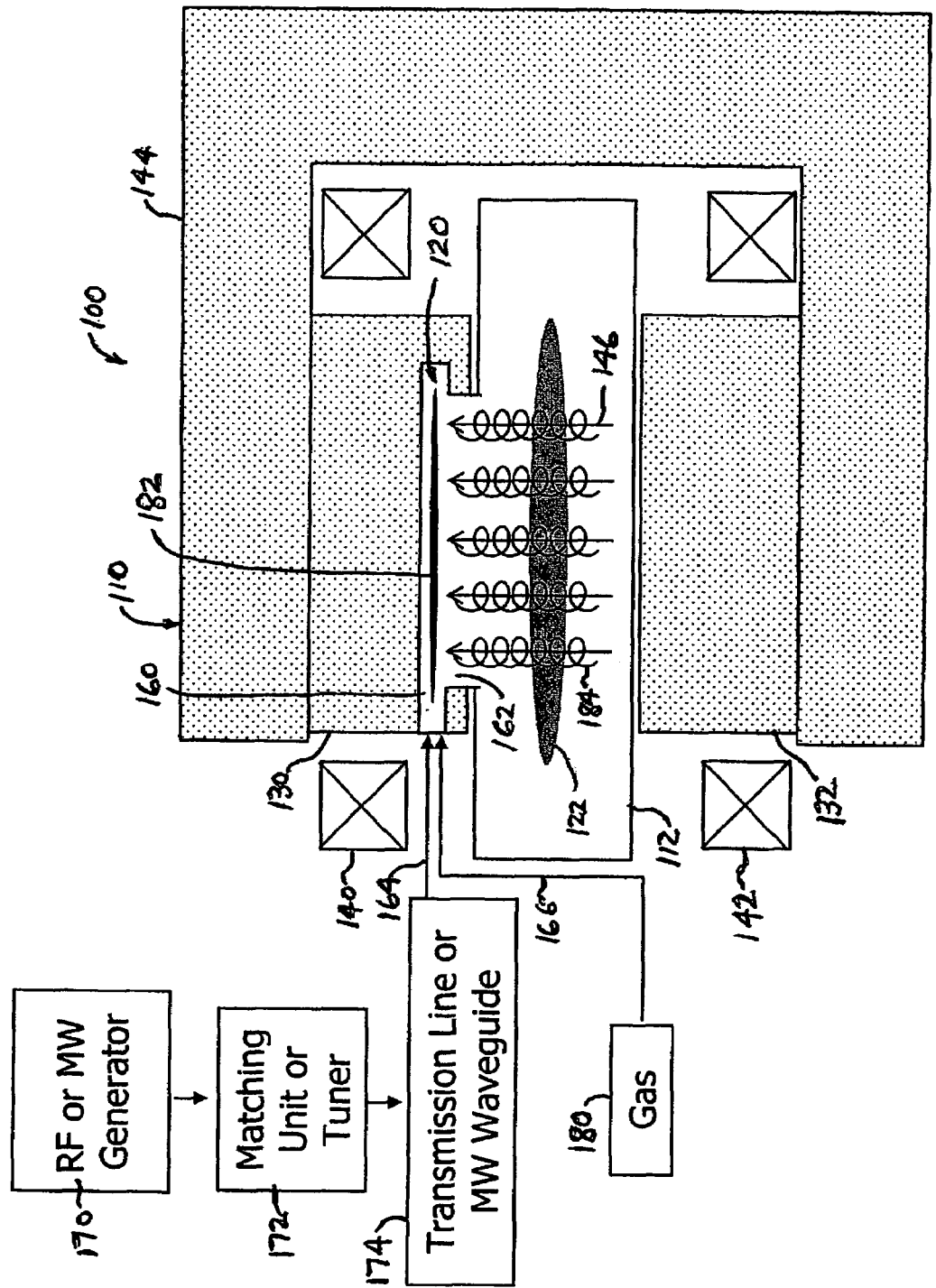
FIG. 2 is a schematic block diagram of a magnet assembly in accordance with a first embodiment of the invention.

A schematic block diagram of a magnet assembly 100 in accordance with an embodiment of the invention is shown in FIG. 2. The magnet assembly includes a magnet having spaced-apart polepieces and one or more electron sources to inject electrons between the polepieces, as described below. It will be understood that a plasma flood gun is a type of electron source. The magnet assembly may be incorporated into an ion implanter as a resolving magnet, an angle corrector magnet, a beam filter, a multipole focusing element or any other component requiring a magnet. An ion implanter may include one or more magnet assemblies, and one or more of the magnet assemblies may include at least one electron source as described herein.

Magnet assembly 100 may include a magnet 110, a flight tube 112 and at least one electron source. In the embodiment of FIG. 2, magnet assembly 100 includes at least one radio frequency (RF) or microwave (MW) plasma flood gun 120 positioned to inject electrons into an ion beam 122 being transported through flight tube 112. In other embodiments, magnet assembly 100 may include at least one filament-driven plasma flood gun. In FIG. 2, magnet 110 is viewed along the direction of transport of ion beam 122.

Magnet 110 includes polepieces 130 and 132, magnet coils 140 and 142 disposed around polepieces 130 and 132, respectively, and a magnet element 144 which provides a return path for magnetic fields. When magnet coils 140 and 142 are energized by a magnet power supply (not shown), a magnetic field 146 is produced in flight tube 112. The magnetic field 146 is generally perpendicular to the direction of ion beam transport and deflects ion beam 122 as known in the art.

RF or microwave plasma flood gun 120 includes a plasma flood gun chamber 160, which may be positioned between polepieces 130 and 132 or in a cavity in one or both polepieces 130 and 132, as described below. Chamber 160 includes a slit 162, or one or more holes or other apertures that provide a path for injection of electrons from the interior of chamber 160 to flight tube 112. Chamber 160 further includes a power connection 164 and a gas connection 166. An RF or microwave generator 170 is connected via a matching unit or tuner 172 and a transmission line or a microwave waveguide 174 to plasma flood gun chamber 160 via power connection 164. As described below, a variety of different RF or microwave generators, connectors and other components may be utilized within the scope of the invention. A gas source 180 is connected to the plasma flood gun chamber 160 via gas connection 166. Gases such as xenon, argon and other noble gases may be utilized, for example. Gases are not limited to noble gases, however.

When RF energy is supplied to chamber 160 by generator 170 and gas is supplied to chamber 160 by gas source 180, a plasma 182 is formed in plasma flood gun chamber 160. Electrons from plasma 182 are injected through slit 162 into flight tube 112 and follow spiral paths 184 in magnetic field 146. The electrons produce space charge neutralization of ion beam 122 and enhance the transport of ion beam 122 through magnet 110.

A top view of a flight tube showing the position of an RF or microwave plasma flood gun 120 is shown in FIG. 3. As shown, the plasma flood gun 120 extends across the width of the flight tube 112 to provide more or less uniform injection of electrons into the flight tube across its width. In the embodiment of FIG. 3, plasma flood gun 120 is oriented generally orthogonally to the direction of ion beam transport through flight tube 112. The magnet assembly may include additional plasma flood guns, for example, at location 124 or 126, or both, and at additional locations not shown. The locations of the plasma flood guns are selected to provide acceptable neutralization of the ion beam. In other embodiments, one or more plasma flood guns may have an arcuate shape that follows the direction of ion beam transport through flight tube 112. In general, arbitrary numbers, shapes and locations of plasma flood guns may be utilized. FIG. 4 is a side view of magnet assembly 100 showing plasma flood gun 120 positioned above flight tube 112 and mounted in polepiece 130.

The RF or microwave plasma flood gun can have a variety of configurations within the scope of the invention. The plasma flood gun can be mounted in magnets, such as analyzer magnets, angle corrector magnets and filter magnets. Single or multiple plasma flood guns may be utilized. The plasma flood gun may be embedded in the polepiece or may be located at the edge, or surface, of the polepiece. Frequencies may range from a few megahertz to gigahertz frequencies. By way of example only, an RF plasma flood gun may operate in a range of 2-13 megahertz and a microwave plasma flood gun may operate at a frequency of about 2 gigahertz. The plasma flood gun may operate in a resonant or non-resonant (ECR or non-ECR) mode. The plasma flood gun may operate at a single frequency or at multiple frequencies and may operate at a fundamental frequency or a harmonic frequency. Depending on operating frequency and geometry, the plasma flood gun may use an antenna and may have coaxial or waveguide components. Inductive or capacitive coupling may be utilized. In one embodiment, a helicon geometry may be utilized. Single or multi-turn antennas may be utilized. The antenna may be located within the plasma chamber or isolated from the plasma chamber, as described below. The plasma flood gun may include permanent magnets or electromagnets to alter the field produced by the main magnet. The coupling to the ion beam may be through single or multiple slots, multiple aperture holes, or any other aperture configuration. The plasma flood gun may operate in a biased or unbiased mode. In the biased mode, electrons can be accelerated or decelerated into the flight tube from the plasma flood gun.

Figure 5:
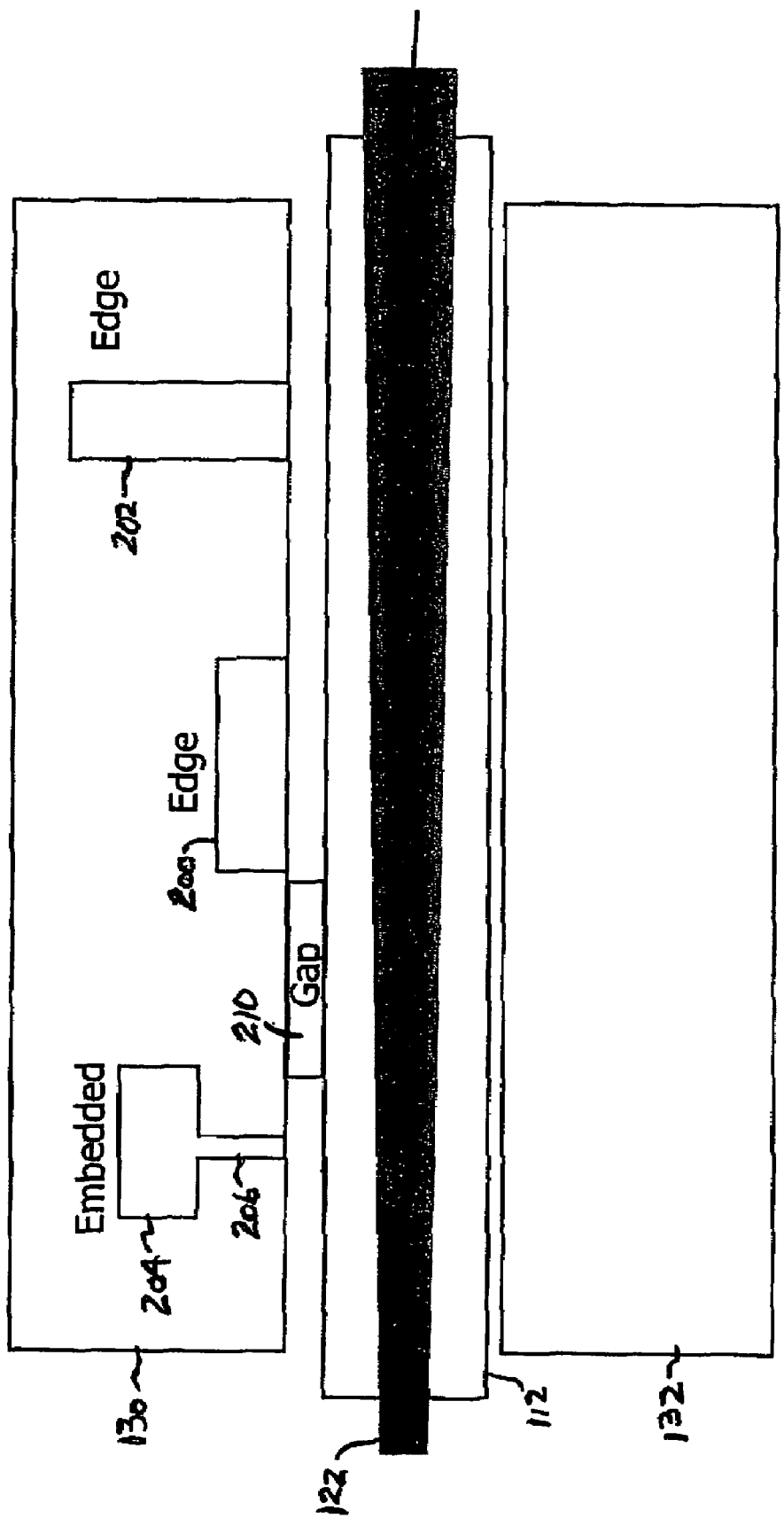
FIG. 5 is a schematic side view of a magnet assembly, illustrating different possible locations and geometries for an RF or microwave plasma flood gun.
Figure 9:
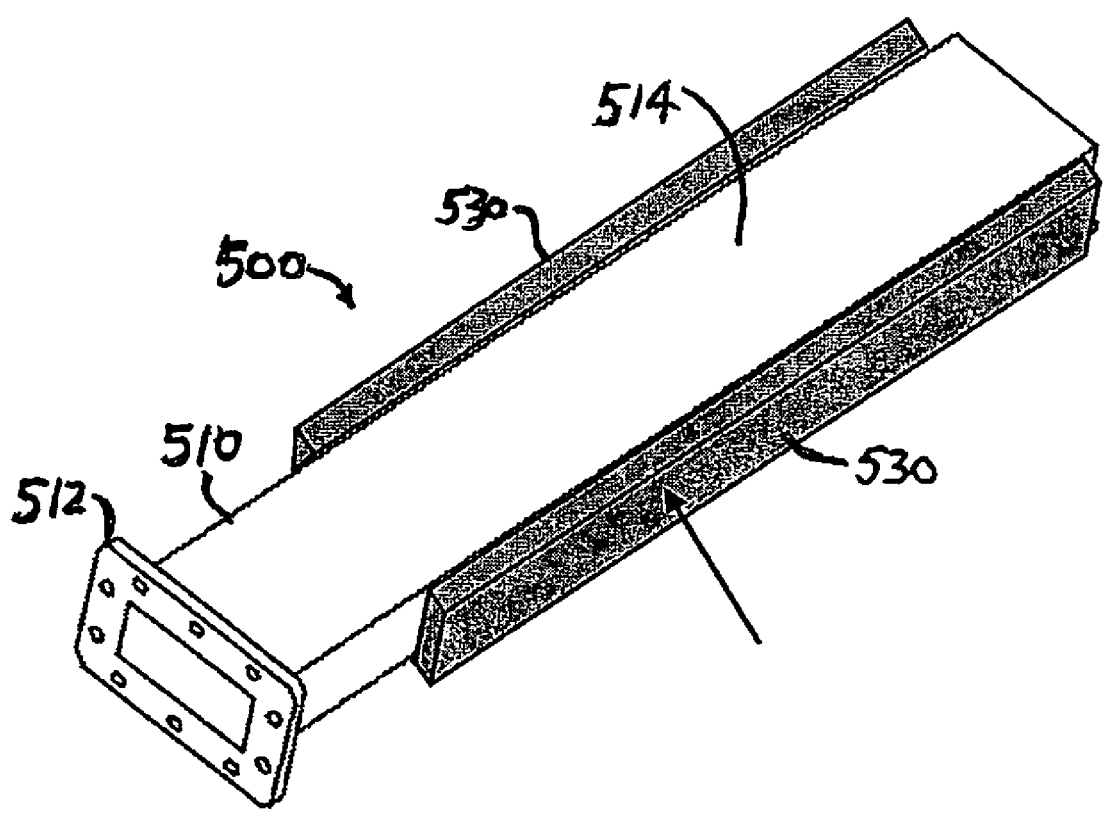
FIG. 9 illustrates a microwave plasma flood gun in accordance with an embodiment of the invention.
Figure 10A:
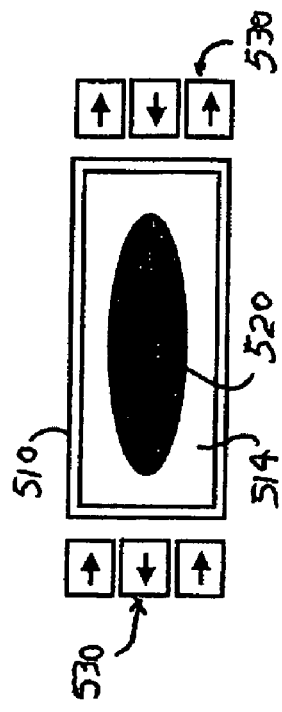
FIGS. 10A-10D are cross-sections of the microwave plasma flood gun of FIG. 9, illustrating different magnet configurations.
Figure 10B:
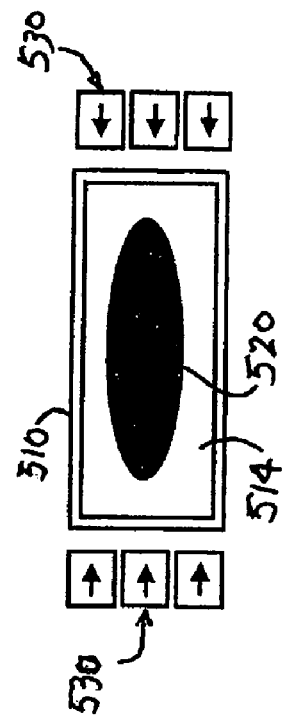
Figure 10C:
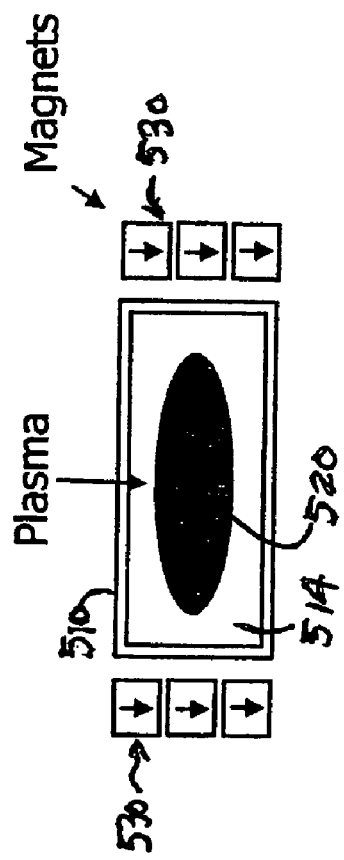
Figure 10D:
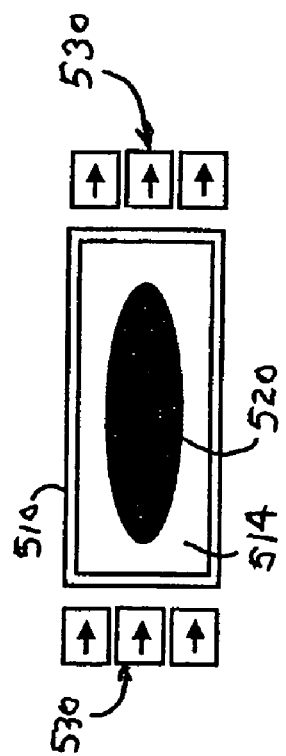

Various plasma flood gun geometries are shown in FIG. 5. In a geometry 200, the plasma flood gun is mounted in a recess in the surface of polepiece 130 that faces flight tube 112. The long dimension of the recess is parallel to ion beam 122. In a geometry 202, the plasma flood gun is mounted in a recess in the surface of polepiece 130 that faces flight tube 112, and the long dimension of the recess is perpendicular to ion beam 122. In a geometry 204, the plasma flood gun is embedded in a cavity with polepiece 130 and is coupled to flight tube 112 through a slot 206 or other aperture. In a geometry 210, the plasma flood gun is mounted in a gap between polepiece 130 and flight tube 112. It will be understood that one or more plasma flood guns can be utilized within the scope of the present invention. The plasma flood guns can be mounted in the top polepiece 130, the bottom polepiece 132, or both. A variety of different plasma flood gun geometries may be utilized.

Various RF plasma flood gun geometries are shown in FIG. 6. In each case, an antenna 300 and a plasma 302 are shown. In geometries 310, 312, 314 and 316, antenna 300 is exposed to plasma 310. In geometries 320, 322, 324, 326 and 328, antenna 300 is isolated from plasma 302 by an insulating housing 330, which may be a ceramic material, for example. As noted above, any of the geometries can be utilized in polepiece 130, polepiece 132, or both. The RF plasma flood guns may be utilized in single or multi-turn antennas.

An example of an RF plasma flood gun is shown in FIG. 7. An RF plasma flood gun 400 includes a housing 410 defining a plasma flood gun chamber 412 and having one open side. An antenna 420 is mounted within chamber 412 and is coupled to terminals 422 and 424 for connection to an RF power source. An aperture 430 permits a gas to be supplied to chamber 412.

The location for mounting plasma flood gun 400 on flight tube 112 is shown in FIG. 8. An aperture plate 440 defines a slot 442 of known width and length. The plasma flood gun 400 shown in FIG. 6 is flipped over and is mounted on flight tube 112 above aperture plate 440.

An example of a microwave plasma flood gun 500 is shown in FIGS. 9 and 10A-10D. A microwave waveguide 510 includes a connector 512 for coupling to a microwave power source. The microwave waveguide 510 defines a chamber 514 for supporting a plasma 520. Waveguide 510 may include an aperture (not shown) for introduction of a gas and a slot or other aperture (not shown) for injection of electrons into flight tube 112. Plasma flood gun 500 may further include magnets 530 to control the magnetic field within waveguide 510. Different examples of magnets 530 are shown in FIGS. 10A-10D. Magnets 530 may be utilized to provide resonance in chamber 514 using vertical fields, horizontal fields or cusped fields. Gas injection may be on the sides or the end of waveguide 510 and may be at a single point or distributed. Any configuration of slits or holes for injection of electrons into flight tube 112 may be utilized. Coupling of microwave energy to chamber 514 may be by microwave waveguide, coaxial line, or a loop antenna.

Figure 11:
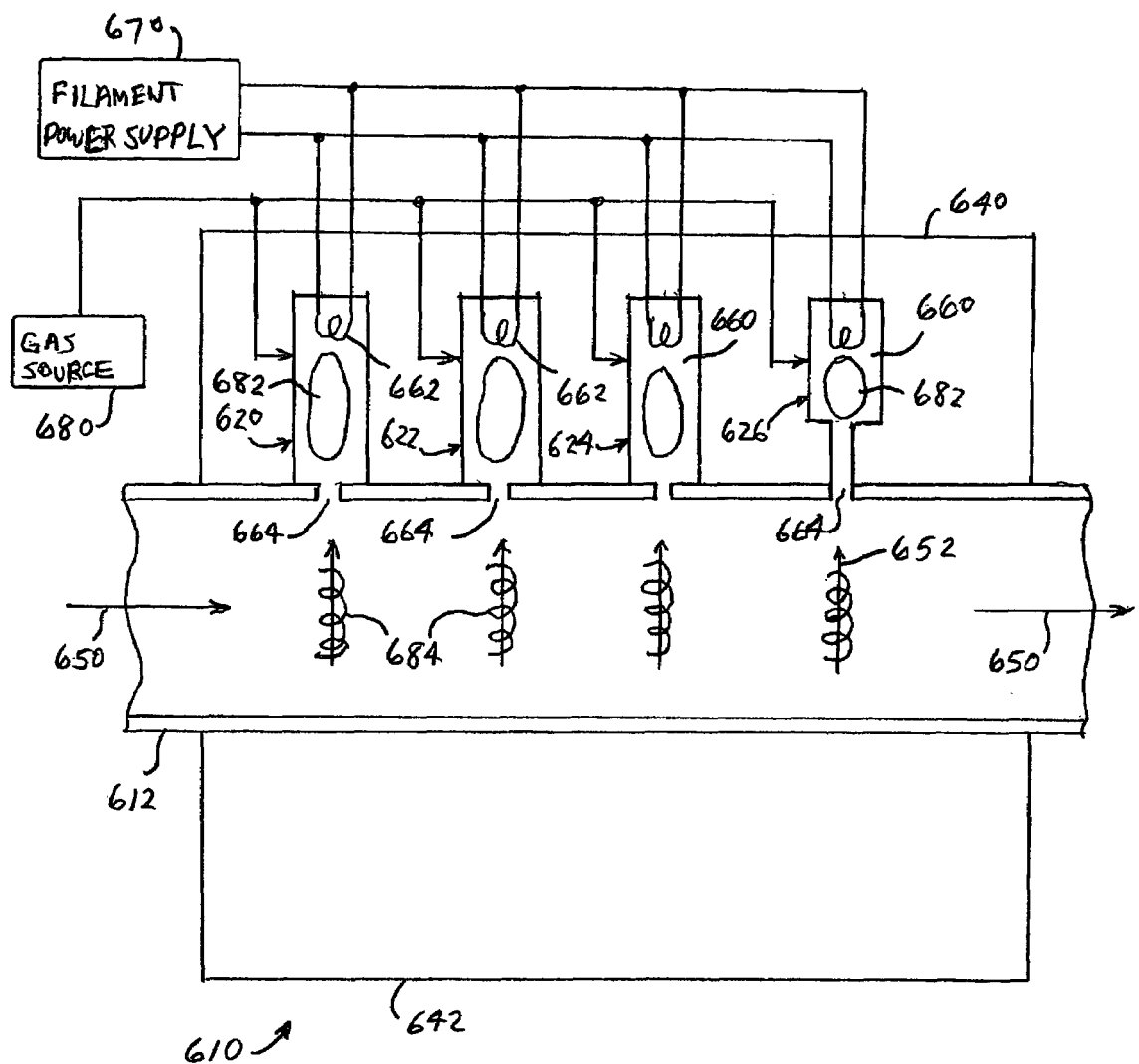
FIG. 11 is a schematic side view of a magnet assembly in accordance with an embodiment of the invention.
Figure 12:
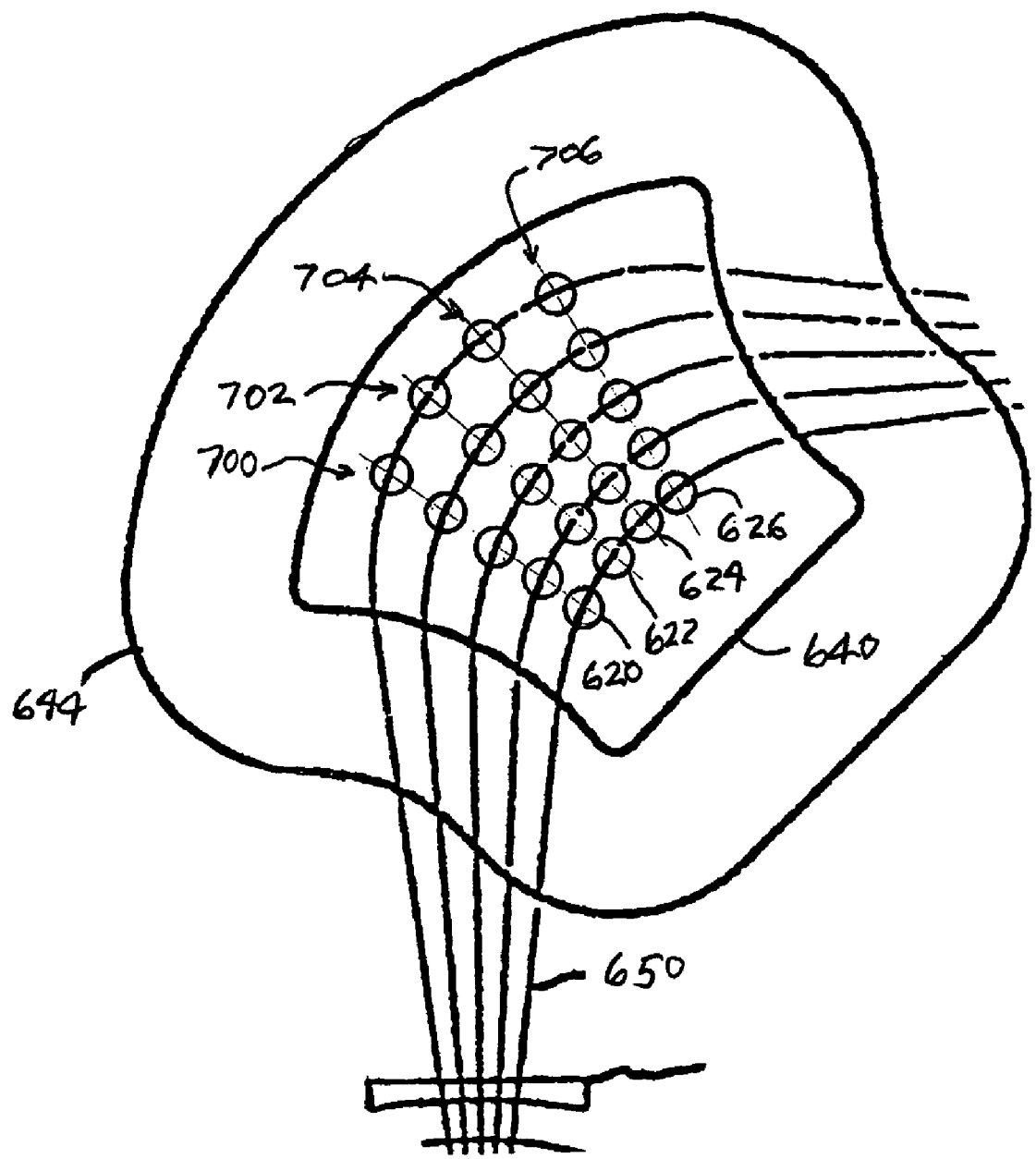
FIG. 12 is a schematic top view of the magnet assembly of FIG. 11.

A magnet assembly in accordance with further embodiments of the invention is illustrated in FIGS. 11 and 12. FIG. 11 is a side view of the magnet assembly, and FIG. 12 is a top view of the magnet assembly. The magnet assembly includes a magnet 610, a flight tube 612 and one or more electron sources 620, 622, 624 and 626. Magnet 610 includes polepieces 640 and 642, magnet coils 644 disposed around polepieces 640 and 642, respectively, and a magnet power supply (not shown) coupled to magnet coils 644.

An ion beam 650 is transported through flight tube 612 between polepieces 640 and 642. When the magnet power supply is energized, a magnetic field 652 is produced in flight tube 612. The magnetic field 652 is generally perpendicular to the direction of ion beam transport and deflects ion beam 650 as known in the art.

Electron sources 620, 622, 624, and 626 are located in cavities in one or both of polepieces 640 and 642. Each electron source includes a chamber 660 and an electron-emitting filament 662 located in chamber 660. Flight tube 612 includes apertures 664 that permit gas communication between each chamber 660 and the interior of flight tube 612. In some embodiments, the electron sources may be embedded in the interior of one or both of polepieces 640 and 642. In FIG. 11, electron source 626 is embedded in polepiece 640. In other embodiments, the electron sources may be located in recesses in a surface of one or both of polepieces 640 and 642 which faces flight tube 612. In FIG. 11, electron sources 620, 622 and 624 are located in recesses in a surface of polepiece 640. The electron sources may all be embedded in a polepiece, may all be located in recesses in a polepiece, or may include a mix of embedded and surface mounting locations.

The filaments 662 in each of the electron sources are coupled to a filament power supply 670 or to individual filament power supplies. A gas source 680 is connected to the chamber 660 of each of the electron source 620, 622, 624 and 626. Gases such as xenon, argon, and other noble gases may be utilized, for example. Gases are not limited to noble gases, however.

In operation, filaments 662 are heated by electrical currents from filament power supply 670 and gas is supplied to each chamber 660 by gas source 680. The heated filaments 662 emit electrons, and a plasma 682 is formed in each chamber 660. Electrons from plasma 682 in each chamber 660 are injected through apertures 664 into flight tube 612 and follow spiral paths 684 in magnetic field 652. The electrons produce space charge neutralization of ion beam 650 and enhance the transport of ion beam 650 through magnet 610.

As indicated above, the magnet assembly may include one or more electron sources. The electron sources may be arranged in one or more rows. Each row may be oriented generally orthogonally with respect to the ion beam. In the embodiment shown in FIG. 12, the magnet assembly includes rows 700, 702, 704 and 706 of electron sources. Each row is oriented laterally with respect to the direction of ion beam transport. In other embodiments, electron sources may be arranged along the direction of ion beam transport through flight tube 612. In general, the electron sources may have an arbitrary arrangement, which may be regular or irregular. The locations of the electron sources are selected to provide beam neutralization as ion beam 650 is transported through flight tube 612.

Figure 13:
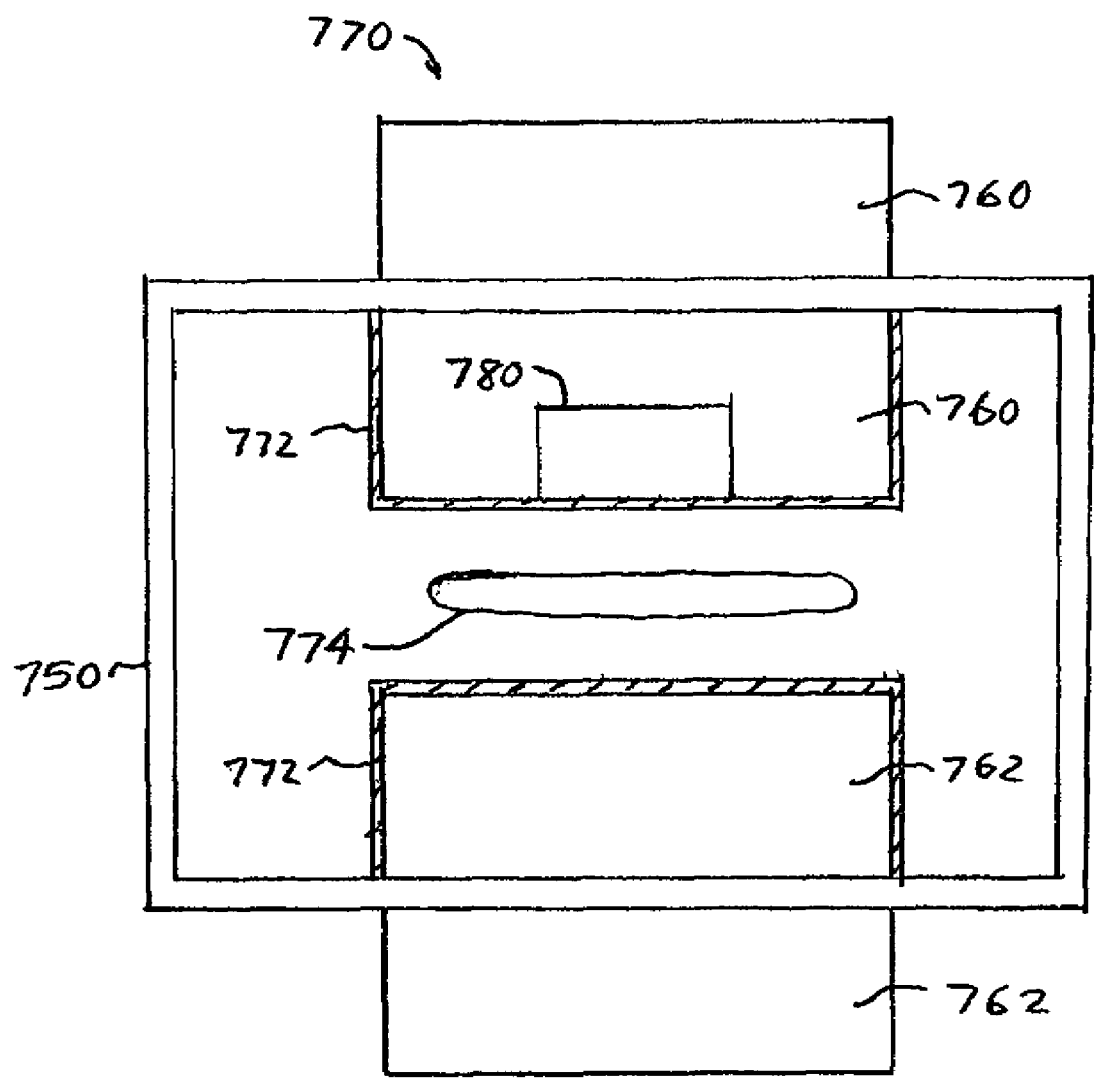
FIG. 13 is a schematic cross-sectional view of a magnet assembly in accordance with a further embodiment of the invention.

In the embodiments described above, the polepieces of the magnet are located outside the flight tube, and the flight tube is vacuum pumped for effective ion beam transport. In further embodiments, the polepieces of the magnet may extend into the flight tube. A cross-section of a magnet assembly in accordance with an additional embodiment is shown in FIG. 13. A flight tube 750 partially encloses polepieces 760 and 762 of a magnet 770. The portions of polepieces 760 and 762 inside flight tube 750 may include polepiece liners 772, which may be graphite. Polepiece liners 772 prevent ion beam 774 from contacting polepieces 760 and 762. An electron source 780 is located in a cavity in polepiece 760. Electron source 780 may have any of the configurations described above.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A magnet assembly for operation with an ion beam, comprising: a magnet including spaced-apart first and second polepieces; a flight tube for transport of an ion beam between the first and second polepieces; and an electron source entirely embedded in a cavity in at least one of the first and second polepieces to inject electrons into the flight tube through a slot, the cavity in communication with the slot having an opening dimension into the flight tube less than a size of the cavity.

2. A magnet assembly as defined in claim 1, wherein the electron source comprises a plurality of electron sources embedded in one or more cavities in at least one of the first and second polepieces.

3. A magnet assembly as defined in claim 2, wherein the electron sources of the plurality of electron sources are arranged in a row orthogonal to the ion beam.

4. A magnet assembly as defined in claim 2, wherein the electron sources of the plurality of electron sources are arranged in one or more rows.

5. A magnet assembly as defined in claim 1, wherein the electron source comprises an elongated electron source having a long dimension generally orthogonal to the ion beam.

6. A magnet assembly as defined in claim 1, wherein the electron source includes an electron-emitting filament.

7. A magnet assembly as defined in claim 1, wherein the electron source is configured as a radio frequency (RF) plasma flood gun.

8. A magnet assembly as defined in claim 7, wherein the RF plasma flood gun includes a plasma flood gun chamber and an antenna located in the plasma flood gun chamber.

9. A magnet assembly as defined in claim 7, wherein the RF plasma flood gun includes a plasma flood gun chamber and an antenna located external to the plasma flood gun chamber.

10. A magnet assembly as defined in claim 1, wherein the electron source is configured as a microwave plasma flood gun.

11. A magnet assembly as defined in claim 10, wherein a plasma flood gun chamber is defined by a microwave waveguide.

12. A magnet assembly as defined in claim 1, wherein the flight tube includes one or more holes for coupling electrons from the electron source into the flight tube.

13. A magnet assembly as defined in claim 1, wherein the flight tube includes one or more slots for coupling electrons from the electron source into the flight tube.

14. A magnet assembly as defined in claim 1, wherein at least one of the first and second polepieces extends into the flight tube and wherein the electron source is positioned in a portion of the polepiece within the flight tube.

15. An ion implanter comprising: an ion source to generate an ion beam; a magnet including spaced-apart first and second polepieces; a flight tube for transport of the ion beam between the first and second polepieces; an electron source entirely embedded in a cavity in at least one of the first and second polepieces to inject electrons into the flight tube through a slot, the cavity in communication with the slot having an opening dimension into the flight tube less than a size of the cavity, and a target site downstream of the magnet to support a target for ion implantation, wherein the ion beam is transported through the flight tube to the target site.

16. An ion implanter as defined in claim 15, wherein the electron source comprises one or more rows of individual electron sources.

17. An ion implanter as defined claim in 15, wherein the electron source comprises an elongated electron source having a long dimension orthogonal to the ion beam.

18. An ion implanter as defined in claim 15, wherein the electron source includes an electron-emitting filament.

19. An ion implanter as defined in claim 15, wherein the electron source comprises a radio frequency plasma flood gun.

20. An ion implanter as defined in claim 15, wherein the electron source comprises a microwave plasma flood gun.

21. A method for transporting an ion beam through a magnet, comprising: transporting an ion beam between first and second polepieces of a magnet; and injecting electrons into the ion beam being transported between the first and second polepieces from an electron source entirely embedded in a cavity in at least one of the first and second polepieces of the magnet through a slot, the cavity in communication with the slot having an opening dimension into the flight tube less than a size of the cavity.

22. A magnet assembly for operation with an ion beam, comprising: a magnet including spaced-apart first and second polepieces; a flight tube for transport of an ion beam between the polepieces of the magnet; and a radio frequency or microwave plasma flood gun entirely embedded in a cavity in at least one of the first and second polepieces to inject electrons into the flight tube through a slot, the cavity in communication with the slot having an opening dimension into the flight tube less than a size of the cavity.

23. An ion implanter comprising: an ion source to generate an ion beam; a magnet including spaced-apart first and second polepieces; a flight tube for transport of the ion beam between the first and second polepieces; a radio frequency or microwave plasma flood gun entirely embedded in a cavity in at least one of the first and second polepieces to inject electrons into the flight tube through a slot, the cavity in communication with the slot having an opening dimension into the flight tube less than a size of the cavity; and a target site downstream of the magnet to support a target for ion implantation, wherein the ion beam is transported through the flight tube to the target site.

24. A method for transporting an ion beam through a magnet, comprising: transporting an ion beam between first and second polepieces of a magnet; and injecting electrons into the ion beam being transported between the first and second polepieces from a radio frequency or microwave plasma flood gun entirely embedded in a cavity in at least one of the first and second polepieces through a slot, the cavity in communication with the slot having an opening dimension into the flight tube less than a size of the cavity.

* * * * *